United States Patent [19]

Guetersloh

[11] Patent Number: 4,706,808
[45] Date of Patent: Nov. 17, 1987

[54] HUMIDISTAT WITH IMPROVED MOUNTING

[75] Inventor: Timothy L. Guetersloh, Madison, Wis.

[73] Assignee: Research Products Corporation, Madison, Wis.

[21] Appl. No.: 922,241

[22] Filed: Oct. 23, 1986

[51] Int. Cl.$^4$ .............................................. B65D 85/38
[52] U.S. Cl. ................................ 206/305; 174/52 R; 220/4 R; 220/3.3; 220/3.8; 337/380
[58] Field of Search .................. 174/52 R, 52 PE, 58, 174/50; 206/320, 305; 220/4 R, 4 C, 18, 3.8, 3.3; 337/380

[56] References Cited

U.S. PATENT DOCUMENTS

| | | | |
|---|---|---|---|
| 461,195 | 10/1891 | Dillon | 220/3.8 |
| 2,457,347 | 12/1948 | Casler et al. | 174/52 R |
| 3,112,148 | 11/1963 | Wochner | 220/3.8 |
| 3,176,062 | 3/1965 | Nordstrom et al. | |
| 3,523,217 | 8/1970 | Stiles | |
| 3,542,233 | 11/1970 | Golden | |
| 3,670,284 | 6/1972 | Fortier | 337/380 |
| 3,752,900 | 8/1973 | Harrison et al. | |
| 4,296,454 | 10/1981 | Wong | |
| 4,451,693 | 5/1984 | Vest | |

Primary Examiner—Joseph Man-Fu Moy
Attorney, Agent, or Firm—Andrus, Sceales, Starke & Sawall

[57] ABSTRACT

A humidistat (17) generally includes a humidity sensing cartridge (20) adapted to be enclosed within a housing (18) having a base (21) and a front cover (22). The cartridge includes a plurality of engageable portions (24, 28). The housing base includes a peripheral frame (34) which surrounds and generally defines an enlarged rear opening (36) dimensioned to receive a humidity sensing cartridge therethrough. A plurality of flexible legs (38-40) extend forwardly from the base frame and have cams (41) and latches (42) adjacent their forward ends. A plurality of rigid posts (44, 45, 55) also extend forwardly from the base frame and include cams (52) terminating in openings (54) in the post walls. In assembly the cartridge to the base, the cartridge (20) is passed through the frame opening (36) from behind and rides onto the flexible leg cams (41) and snaps into place. Stops (50, 51) on at least some of the flexible legs and rigid posts limit the forward cartridge movement. Furthermore, at least some of the posts include locating corners (48) for properly positioning the cartridge. The leg latches (42, 43) may be constructed to accommodate cartridges of slightly different dimensions. The housing cover (22) includes a plurality of rearwardly extending flexible latch legs (59-61) and a plurality of cams (63, 64) on its peripheral wall. When the cover is assembled to the housing base, the cams (63, 64) locate the base (21) and the latch legs ride onto the cams (52) of the base posts (44, 45, 55) and snap into place.

15 Claims, 9 Drawing Figures

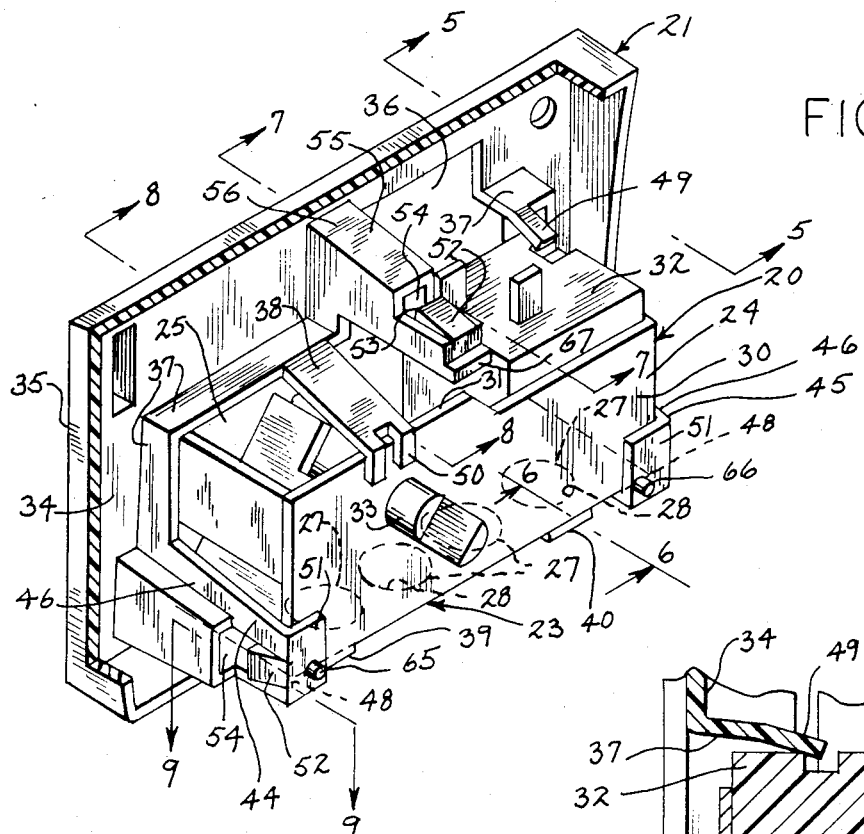
FIG. 4
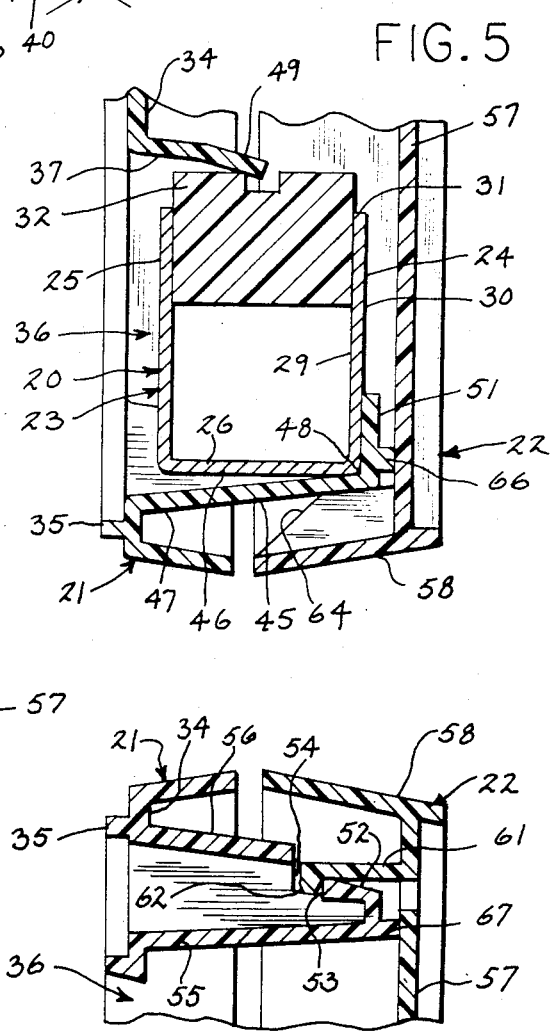
FIG. 5
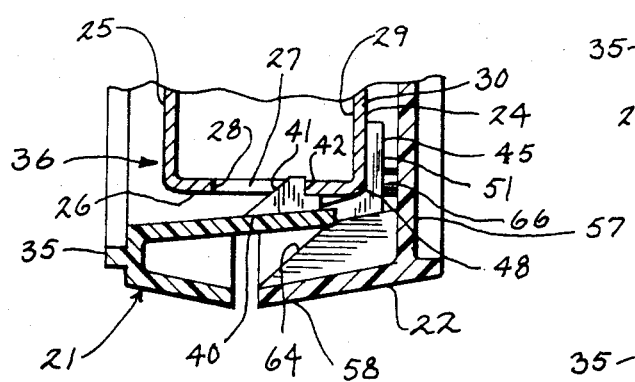
FIG. 6
FIG. 7

4,706,808

HUMIDISTAT WITH IMPROVED MOUNTING

U.S. PRIOR ART OF INTEREST

| U.S. PRIOR ART OF INTEREST | | |
| --- | --- | --- |
| U.S. Pat. No. | Inventor | Issued |
| 3,176,062 | Nordstrom et al | Mar. 30, 1965 |
| 3,523,217 | Stiles | Aug. 4, 1970 |
| 3,542,233 | Golden | Nov. 24, 1970 |
| 3,752,900 | Harrison et al | Aug. 14, 1983 |
| 4,296,454 | Wong | Oct. 20, 1981 |
| 4,451,693 | Vest | May 29, 1984 |

BACKGROUND AND SUMMARY OF THE INVENTION

This invention relates to a humidistat with improved mounting. Such humidistats are adapted to sense ambient humidity and then control a usually remote device for humidifying room air. The humidistats are often mounted on a wall in the living area of a home, and control a humidifier or dehumidifier disposed in another area.

Various humidistat mounting devices have been used over the years. One such device is disclosed in the above-identified U.S. Pat. No. 3,523,217. Another device has been commercially sold by the Assignee of the present inventor for many years. This prior commercial device generally has included a humidity sensing cartridge enclosed in a housing, with the latter including a wall-mountable base and a cover attached to the base.

More specifically, the base of the prior commercial device was generally planar and provided a basically closed wall throughout its extent. The humidity sensing cartridge was mounted to the front face of the wall by screws extending therethrough. A cover was attachable to the base via forwardly extending spring clips on the base ends, which latched over projections formed on the cover ends.

The prior commercial device has been found to have certain disadvantages, especially related to the time and labor involved in assembling the unit. The base and humidity sensing cartridge had to be manually aligned to bring the attachment holes into registry, and then the devices had to be screwed together. Furthermore, manual alignment between the base and cover had to be accomplished before they could be joined.

It is an object of the present invention to provide an improved humidistat mounting which obviates the aforementioned disadvantages. It is a further object to provide a mounting which can be quickly and easily assembled without the need for screws or the like. It is yet another object to provide a humidistat housing which can be economically manufactured, and which can be easily assembled and disassembled at will.

In accordance with the various aspects of the present invention, a humidistat generally includes a humidity sensing cartridge adapted to be enclosed within a housing having a base and a front cover. The cartridge includes a plurality of engageable portions.

The housing base includes a peripheral frame which surrounds and generally defines an enlarged rear opening dimensioned to receive a humidity sensing cartridge therethrough. A plurality of flexible legs extend forwardly from the base frame and have cams and latches adjacent their forward ends. A plurality of rigid posts also extend forwardly from the base frame and include cams terminating in openings in the post walls. In assembling the cartridge to the base, the cartridge is passed through the frame opening from behind and rides onto the flexible leg cams and snaps into place. Stops on at least some of the flexible legs and rigid posts limit the forward cartridge movement. Furthermore, at least some of the posts include locating corners for properly positioning the cartridge. The leg latches may be constructed to accommodate cartridges of slightly different dimensions.

The housing cover includes a plurality of rearwardly extending flexible latch legs and a plurality of cams on its peripheral wall. When the cover is assembled to the housing base, the cams locate the base and the latch legs ride onto the cams of the base posts and snap into place.

BRIEF DESCRIPTION OF THE DRAWINGS

The accompanying drawings illustrate the best mode presently contemplated by the inventor for carrying out the invention.

In the drawings:

FIG. 4 is an enlarged front perspective view of the sub-assembly of the humidity sensing cartridge and housing base, the cover being removed for purposes of clarity;

FIG. 5 is a section taken on line 5—5 of FIG. 4 with the cover in place;

FIG. 6 is a section taken on line 6—6 of FIG. 4 with the cover in place and showing a housing base leg latched into a humidity sensing catridge side wall;

FIG. 7 is a section taken on line 7—7 of FIG. with the cover in place and showing one part of the latching mechanism between the housing cover and base;

DESCRIPTION OF THE PREFERRED EMBODIMENT

Figure 1:
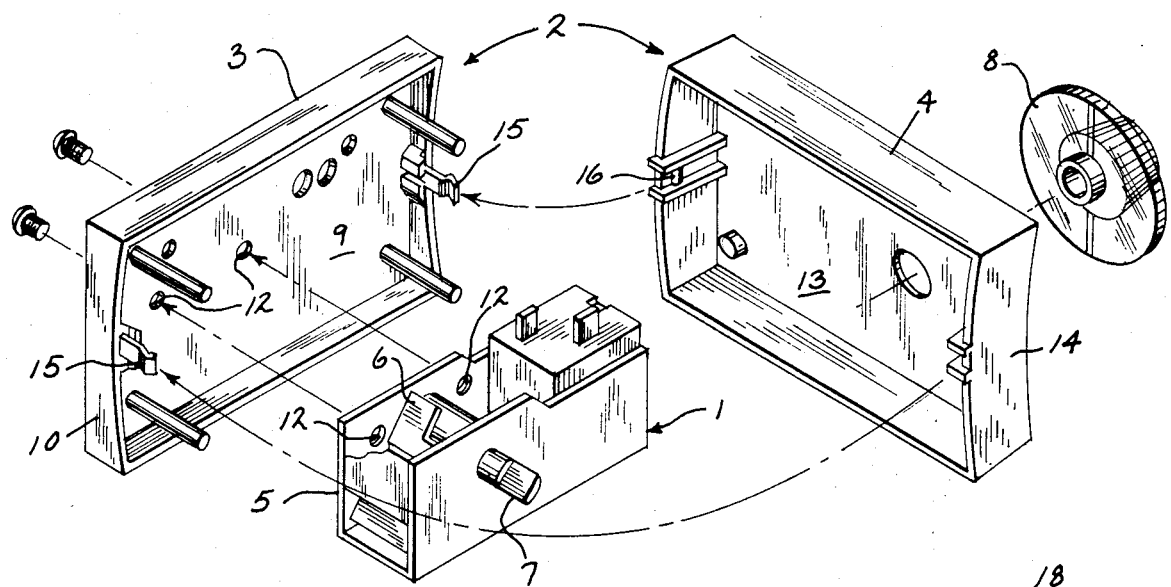
FIG. 1 is an exploded internal perspective view of the aforementioned prior commercial device.

FIG. 1 shows the aforementioned prior commercial construction of a humidistat mounting arrangement and which generally includes a humidity sensing cartridge 1 which is adapted to be enclosed within a housing 2 which may be mounted on a wall or other suitable surface. Housing 2 includes a base 3 and a cover 4.

More specifically, cartridge 1 is generally rectangular in configuration and has a frame 5 which mounts humidity sensing mechanism 6 in any well-known manner. A shaft 7 extends from mechanism 6 and through frame 5 for rotatable adjustment, as by a knob 8, of the desired humidity setting. Housing base 3 includes a rearwardly disposed back wall 9 which is generally planar and closed, and is surrounded by a forwardly extending peripheral side wall 10. Back wall 9 may be suitably attached to a room wall or the like, and is adapted to mount humidity sensing cartridge 1 on its front face, as by screws 11 which pass through aligned openings 12 therein. Housing cover 4 includes a forwardly disposed front wall 13 which is surrounded by a peripheral side wall 14. As shown, housing base 3 is provided with a pair of opposed forwardly extending spring clips 15 on the ends of side wall 14, while the ends of housing cover wall 14 are provided with a pair of opposed projections or tabs 16. When cover 4 is applied to base 3, spring clips 15 snap over tabs 16 to thus hold cover 4 in place.

As previously discussed, the time and labor required to assemble the prior commercial device is considered to be too lengthy. Not only do the screws 11 have to be installed, but manual alignment of the parts, such as by "eyeballing", is necessary. The device shown in FIGS. 2–9 essentially overcomes these difficulties.

Figure 2:
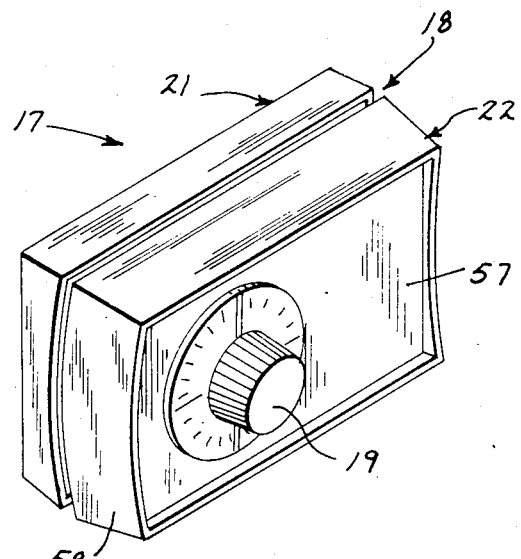
FIG. 2 is a perspective view of the assembled device of the present invention.
Figure 3:
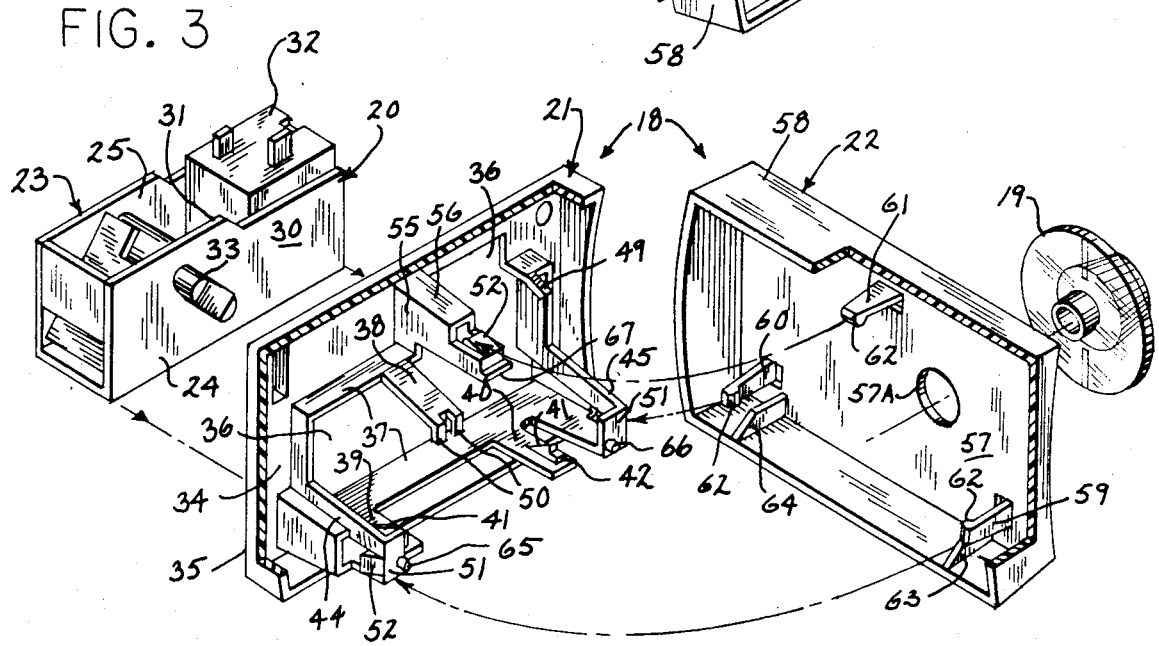
FIG. 3 is an exploded internal perspective view of the device of the present invention.

Turning now to the various aspects of the present invention, and referring especially to FIGS. 2–4, a humidistat 17 having a housing 18 and control knob 19 is adapted for control of a humidifier or dehumidifier, not shown. The humidistat generally comprises a humidity sensing cartridge 20 which is disposed within housing 18, the latter comprising a rearwardly positioned base 21 and a front cover 22, both of which may be integrally molded of suitable plastic if desired.

Humidity sensing cartridge 20 is shown as being generally rectangular and having a frame 23 including longitudinally extending front and rear walls 24, 25 respectively, which are joined along their lower edges by a longitudinal side wall 26, the latter having a plurality of openings 27 with peripheral edges 28. See FIGS. 4 and 6. Front wall 24 is provided with a rear face 29 and a front face 30 joined by a longitudinal edge 31. The interior of cartridge 20 contains the usual sensing mechanism 32 which also transmits information to the remote device. A control shaft 33 extends forwardly from mechanism 32 and through front wall 24 for receipt of manual adjustment knob 19 thereover.

Housing base 18 comprises a rectangular frame 34 which may have a peripheral flange 35 on its rearward side, and which defines a generally rectangular enlarged rear opening 36 dimensioned to approximate the rectangular dimensions of cartridge front and rear walls 24, 25 so that cartridge 20 can pass forwardly and rearwardly through the opening, as will be described.

Figure 8:
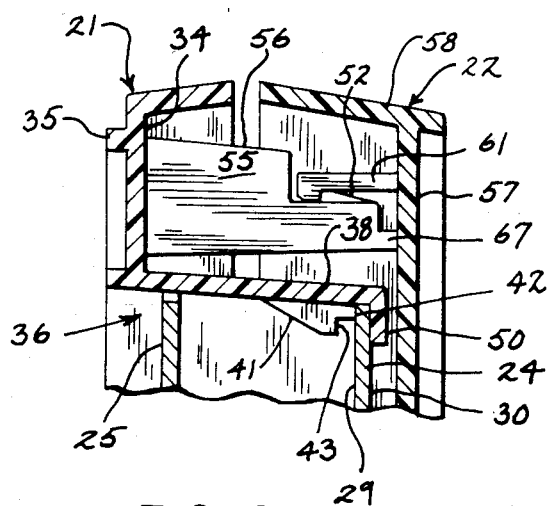
FIG. 8 is a section taken on line 8—8 of FIG. 4 with the cover in place and showing said one part of the latching mechanism of FIG. 7, as well as one part of the latching mechanism between the humidity sensing cartridge and housing base.
Figure 9:
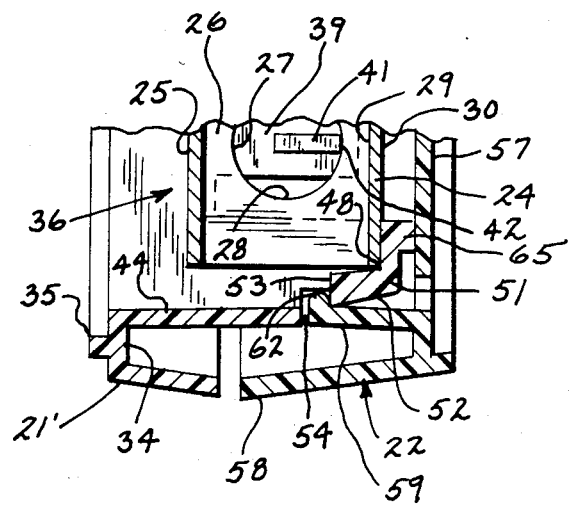
FIG. 9 is a section taken on line 9—9 of FIG. 4 with the cover in place and showing another part of the latching mechanism between the housing cover and base.

In accordance with an aspect of the invention, means are provided on housing base 21 to cooperate with and removably and automatically latch cartridge 20 in place on base 21, thus providing a sub-assembly. For this purpose, and referring to FIGS. 4, 6 and 8, a generally rectangular interrupted rib 37 extends forwardly from rear base wall 25, generally surrounding opening 36. A plurality of flexible springable legs 38, 39 and 40 are integral with rib 37 (and thus base 21) and extend forwardly therefrom. One leg 38 is disposed along the upper extent of rib 37, while the other two legs 39 and 40 are disposed and spaced along the lower extent of rib 37, thus providing for a three-point generally triangular contact with cartridge 20. Legs 38–40 are generally similar and include forwardly extending cams 41 which terminate in a latch step 42. Upper leg 38 is shown in FIG. 8 as having an additional latch step 43 to accommodate cartridges 20 of slightly different dimensions. The other legs 39 and 40 may also have such double latch steps.

Means are also provided to cooperate with and properly automatically locate cartridge 20 in a longitudinal as well as transverse direction. For this purpose, a pair of relatively rigid longitudinally spaced posts 44, 45 are integral with rib 37 (and thus base 21) and extend forwardly from the lower rib corners. Posts 44 and 45 each comprise a side wall 46 and a bottom wall 47, with the outer terminal wall portions being disposed at approximately 90 degrees to form right angled locating corners 48 which can receive the lower cartridge corners. Furthermore, a flexible springable biasing tab 49 is spaced longitudinally from upper springable leg 38.

Furthermore, stop means are provided to limit forward movement of cartridge 20 relative to base 21. For this purpose, and as shown in FIGS. 4 and 8, a prong 50 extends downwardly from the outer terminus of upper springable leg 38. In addition, an abutment 51 joins the terminus portion of posts 44 and 45 at locating corners 48. See FIGS. 3–5 and 9. Prong 50 and abutments 51 are disposed in approximately the same plane when the device is fully assembled.

In accordance with further aspects of the invention, and referring to FIGS. 3, 4, and 7–9, cooperative means are provided on housing base 21 and cover 22 to aligningly and removably latch the two elements together to form a final humidistat assembly. For this purpose, posts 44 and 45 on base 21 are provided with rearwardly extending cams 52 on their side walls 46, with the cams terminating at their rearward ends in edges 53 adjacent stepped openings 54 in walls 46. In addition, a further post 55 is at least partially integral with rib 37 (and thus base 21) and extends forwardly from the upper longitudinally central portion of base frame 34. Post 55 is generally similar to posts 44 and 45, and also has a rearwardly extending cam 52 which terminates in an edge 53 adjacent a stepped opening 54 in its top wall 56.

Additionally, and referring to FIGS. 3 and 7–9, housing cover 22 comprises a front wall or face plate 57 which is surrounded by a rearwardly extending peripheral side wall 58 having upper and lower longitudinal portions joined at their ends by vertical transverse portions. Face plate 57 is provided with an opening 57A for receipt of control shaft 33 therethrough. Furthermore, a plurality of similar flexible springable latch legs 59, 60 and 61 are integral with and extend rearwardly from face plate 57, with these legs having latches 62 on their rearmost terminal ends. Legs 59 and 60 are spaced longitudinally along the lower portion of face plate 57 with their respective latches adapted to engage posts 44 and 45; while leg 61 is disposed centrally of the upper portion of face plate 57 with its latch adapted to engage post 55.

Finally, and as best shown in FIGS. 3, 5 and 6, a plurality of longitudinally spaced cams 63 and 64 are integrally formed with and extend rearwardly along the lower portion of housing cover side wall 58. Cams 63 and 64 are positioned closely adjacent and below respective latch legs 59 and 60 and are also adapted to engage posts 44 and 45, as will be described.

One method of assembling of the entire unit, as a workman would do, will now be described.

Humidity sensing cartridge 20 is first assembled to housing base 21. As can be seen in FIG. 3, cartridge 20 is placed behind base 20 and pushed forwardly through opening 36. As this is done, edge 31 of cartridge front wall 24 rides up cam 41 of springable top leg 38 until the latter snappingly latches at step 42 or 43 onto wall 24, depending on the particular size of the cartridge 20. At the same time, bottom side wall 26 of cartridge 20 rides onto cams 41 of springable bottom legs 39 and 40 until the latter snappingly latch at steps 42 or 43 onto the edges 28 of cartridge side wall openings 27. Prong 50 on upper leg 38 and abutments 51 on lower posts 44 and 45 prevent further forward cartridge movement. In addition, locating corners 48 on posts 44 and 45 align the cartridge and hold it against transverse downward or longitudinal horizontal movement. Furthermore, the springable nature of upper leg 38 and also of tab 49 bias cartridge 20 toward corners 48 and against bottom walls 47 of posts 44 and 45.

Housing cover 22 is now assembled to base 21 which has previously been sub-assembled with cartridge 20. When cover 22 is generally placed centrally over base 21 and moved rearwardly toward the latter, cams 63 and 64 engage the front forward lower edges of posts 44 and 45 at abutments 51 to thus properly align the cover in a transverse direction relative to the base. In addition, the latches 62 of latch legs 59, 60 and 61 ride onto cams 52 of the respective posts 44, 45 and 55 until they snap over cam edges 53. Forwardly extending stop projections 65, 66 and 67 on the respective posts 44, 45 and 55 are engaged by cover face plate 57, thus limiting the rearward cover movement.

It is also possible to assemble the device by first installing housing cover 22 to housing base 21, and then subsequently assembling humidity sensing cartridge 20 to base 21.

The device of the invention may be easily disassembled without the need for tools. Furthermore, the quick cartridge pass-through, snap-in and alignment features of the above assemblying procedure are believed to be a major improvement over prior known devices of this type.

Various modes of carrying out the invention are contemplated as being within the scope of the following claims particularly pointing out and distinctly claiming the subject matter which is regarded as to the invention.

I claim:

1. A humidistat mounting for a generally rectangular humidity sensing cartridge (20), said mounting including a housing (18) comprising:
   (a) a longitudinally extending housing base (21) having a peripheral frame (34) surrounding and defining an enlarged rear opening (36) dimensioned for passthrough of a said cartridge (20),
   (b) means (38-40) disposed on said frame (34) for latchingly engaging a said cartridge (20) when the latter is passed forwardly through said rear opening (36),
   (c) a housing front cover (22),
   (d) and cooperative means (59-61, 44, 45, 55) disposed on said front cover (22) and said base (21) for joining said cover to said base.

2. A humidistat mounting for a generally rectangular humidity sensing cartridge (20), said mounting including a housing (18) comprising:
   (a) a longitudinal extending housing base (21) having a peripheral frame (34) surrounding and defining an enlarged rear opening (36) dimensioned for passthrough of a said cartridge (20),
   (b) a plurality of first springable latching elements (38-40) extending forwardly from said base frame (34) and with said first latching elements adapted to snappingly latch onto the said engageable portions (24, 28) of a said cartridge (20) when the latter is passed forwardly through said rear opening (36),
   (c) a plurality of relatively rigid posts (44, 45, 55) extending forwardly from said base frame (34),
   (d) a housing front cover (22),
   (e) a plurality of second springable latching elements (59-61) extending rearwardly from said cover,
   (f) and cooperative means (52, 53) disposed on said base posts (44, 45, 55) for snap-in latching engagement by said second latching elements (59-61) when said cover (22) is assembled rearwardly onto said base (21).

3. The device of claim 2 which includes: locating means (48) disposed on at least some of said posts (44, 45) to align a said cartridge (20) in a longitudinal and transverse position.

4. The device of claim 3 wherein said locating means comprises: locating corners (48) delineated by said posts (44, 45).

5. The device of claim 4 which includes biasing means (38, 49) to bias a said cartridge (20) toward said locating corners (48).

6. The device of claim 5 in which said biasing means includes a said first springable latching element (38).

7. The device of claim 5 or 6 in which said biasing means includes a springable tab (49) extending forwardly from said base frame (34).

8. The device of claim 2 or 3 which includes: stop means (50, 51) disposed on at least some of said first latching elements (55) and said posts (44, 45) to limit forward movement of a said cartridge (20).

9. The device of claim 8 wherein said stop means comprises:
   (a) prong means (50) disposed on at least one of said first latching elements (55),
   (b) and abutment means (51) disposed on at least one of said posts (44, 45).

10. The device of claim 9:
    (a) in which a said cartridge (20) includes a planar front wall (24),
    (b) and said prong means (50) and abutment means (51) are disposed for engagement by a said cartridge front wall.

11. The device of claim 2 in which:
    (a) a said cartridge (20) includes a front wall (24) defining a first edge means (31) and a side wall having opening means (27) defining second edge means (28),
    (b) at least one of said first latching elements (38) being disposed to latchingly engage said first edge means (31),
    (c) and at least one of said first latching elements (39, 40) being disposed to latchingly engage said second edge means (28).

12. The device of claim 2 or 11 in which at least some of said first latching elements include multi-step latches (42, 43) for accommodating cartridges (20) of different dimensions.

13. The device of claim 2 which includes: cam means (63, 64) disposed on said housing cover (22) for aligningly engaging at least some of said posts (44, 45) as said cover is assembled to said base (21).

14. The device of claim 2 or 13 which includes: stop projections (65-67) disposed on said posts (44, 45, 55) to limit rearward cover movement during assembly of said cover (22) to said base (21).

15. The device of claim 2 wherein said cooperative means (f) comprises:
    (a) rearwardly extending cam means (52) disposed on said posts (44, 45, 55),
    (b) and edge means (53) on said cam means over which said second latching elements (59-61) snap.

* * * * *